United States Patent
Yaw et al.

(10) Patent No.: US 9,135,837 B2
(45) Date of Patent: Sep. 15, 2015

(54) ILLUMINATION ASSEMBLY HAVING MULTIPLE REFLECTIVE CAVITIES EACH WITH A SINGLE EMITTER

(75) Inventors: Yean Chon Yaw, Penang (MY); Kum Soon Wong, Kuala Lumpur (MY); Chiau Jin Lee, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 255 days.

(21) Appl. No.: 11/941,627

(22) Filed: Nov. 16, 2007

(65) Prior Publication Data

US 2009/0129073 A1    May 21, 2009

(51) Int. Cl.
*F21V 13/04* (2006.01)
*G09F 9/33* (2006.01)
*H01L 25/075* (2006.01)

(52) U.S. Cl.
CPC ............... *G09F 9/33* (2013.01); *H01L 25/0753* (2013.01)

(58) Field of Classification Search
USPC ...................... 362/240, 241, 243, 245; 257/89
See application file for complete search history.

(56) References Cited

U.S. PATENT DOCUMENTS

| | | | | |
|---|---|---|---|---|
| 1,648,490 A | * | 11/1927 | Maltby | 40/573 |
| 1,662,348 A | * | 3/1928 | Stricker | 40/573 |
| 1,688,803 A | * | 10/1928 | Thomas et al. | 40/573 |
| 1,719,394 A | * | 7/1929 | Daniel | 340/463 |
| 3,820,237 A | * | 6/1974 | Effer | 438/27 |
| 4,255,688 A | * | 3/1981 | Nagasawa | 313/499 |
| 4,271,408 A | * | 6/1981 | Teshima et al. | 345/83 |
| 4,593,485 A | * | 6/1986 | Thillays | 40/452 |
| 4,935,665 A | * | 6/1990 | Murata | 313/500 |
| 5,119,174 A | * | 6/1992 | Chen | 257/98 |
| 5,268,828 A | * | 12/1993 | Miura | 362/249.06 |
| 5,534,718 A | * | 7/1996 | Chang | 257/98 |
| 5,660,461 A | * | 8/1997 | Ignatius et al. | 362/241 |
| 6,459,130 B1 | * | 10/2002 | Arndt et al. | 257/432 |
| 6,478,447 B2 | * | 11/2002 | Yen | 362/231 |
| 6,700,137 B2 | * | 3/2004 | Horiuchi et al. | 257/81 |
| 6,949,771 B2 | * | 9/2005 | Yoganandan et al. | 257/99 |
| D510,913 S | * | 10/2005 | Sumitani | D13/180 |
| 6,981,867 B2 | * | 1/2006 | Cao | 433/29 |
| 7,282,740 B2 | * | 10/2007 | Chikugawa et al. | 257/79 |
| 7,318,651 B2 | * | 1/2008 | Chua et al. | 362/11 |
| 7,524,087 B1 | * | 4/2009 | Aizar et al. | 362/267 |
| 2002/0006040 A1 | * | 1/2002 | Kamada et al. | 362/237 |
| 2004/0233671 A1 | * | 11/2004 | Staufert | 362/294 |

* cited by examiner

*Primary Examiner* — Ismael Negron
(74) *Attorney, Agent, or Firm* — Fox Rothschild, LLP

(57) ABSTRACT

A reflector housing having a plurality of cavities formed therein, and a plurality of light emitters mounted in the plurality of cavities. Each of the plurality of cavities contains a single one of the plurality of light emitters.

10 Claims, 6 Drawing Sheets

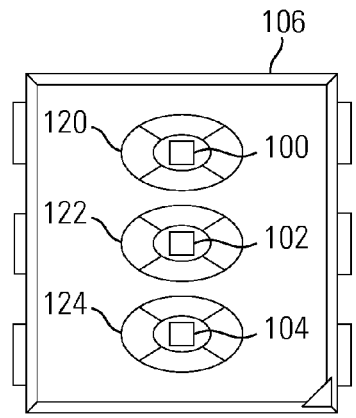
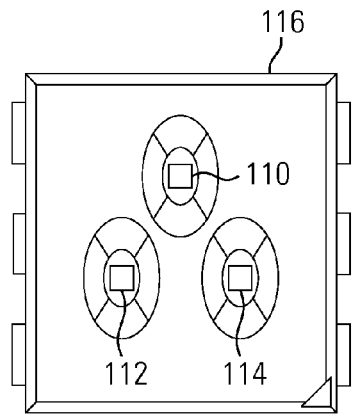
FIG. 9  FIG. 10
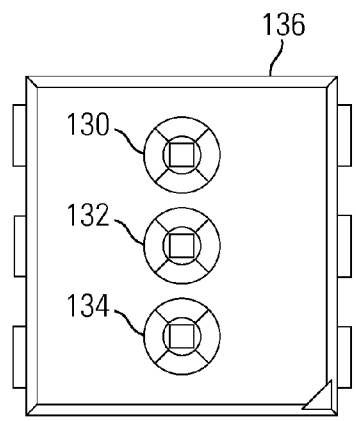
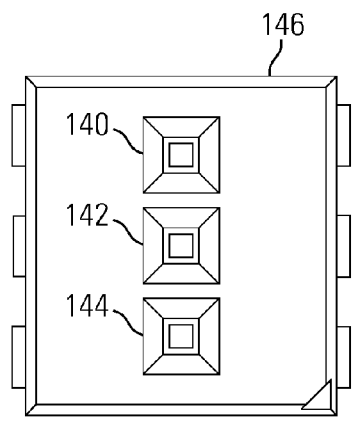
FIG. 11  FIG. 12
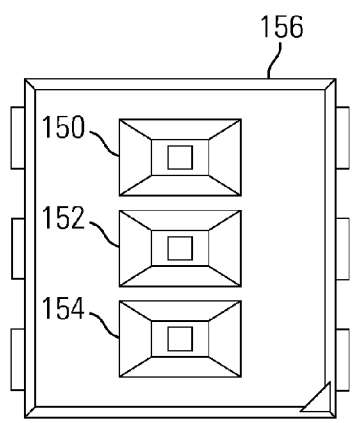
FIG. 13

ILLUMINATION ASSEMBLY HAVING MULTIPLE REFLECTIVE CAVITIES EACH WITH A SINGLE EMITTER

BACKGROUND

Large display panels such as stadium displays may consist of numerous small light emitting illumination assemblies arranged in an array. A typical illumination assembly consists of one or more light emitters such as LED dies mounted in a plastic housing and having some type of mounting connectors, such as surface mount leads. The LED dies may be mounted in a cavity or reflector cup that directs or focuses light in a desired direction from the illumination assembly. In illumination assemblies having multiple light emitters mounted in a single reflector cup, there may be an irregular far field radiation pattern in the overall light from the light emitters. A light emitter mounted in the center of a reflector cup will reflect uniformly from the sides of the reflector cup. However, light emitters being offset from the center of the reflector cup may not reflect uniformly if they are not positioned symmetrically with respect to the sides of the reflector cup. For illumination assemblies having light emitters of different wavelengths, such as red, green and blue (RGB) LED dies, in a single reflector cup, the light emitted from the illumination assembly may not uniformly have the desired color.

BRIEF DESCRIPTION OF THE DRAWINGS

FIG. 9 is a top view of an exemplary illumination assembly having multiple emitters in individual oval reflector cups in a linear arrangement.

FIG. 10 is a top view of an exemplary illumination assembly having multiple emitters in individual oval reflector cups in a nonlinear arrangement.

FIG. 11 is a top view of an exemplary illumination assembly having multiple emitters in individual circular reflector cups.

FIG. 12 is a top view of an exemplary illumination assembly having multiple emitters in individual square reflector cups.

FIG. 13 is a top view of an exemplary illumination assembly having multiple emitters in individual rectangular reflector cups.

DESCRIPTION

The drawings and description, in general, disclose an illumination assembly having multiple emitters and a method of fabricating an illumination assembly having multiple emitters. The illumination assembly has a reflector cup for each of the emitters, thereby closely matching the far field radiation pattern for each of the emitters. The far field radiation pattern may be directed toward the optical axis much more fully and uniformly than with illumination assemblies having multiple emitters located in a single cavity. The viewing angle may be widened or narrowed as desired in all directions away from the optical axis given the additional focusing control provided by placing each light emitter in its own reflector cup, and further by placing a lens adjacent each reflector cup.

The term "far field" is used herein to refer to a region at a sufficient distance from the illumination assembly that light from the multiple emitters in the illumination assembly has been able to visually merge into a combined color. For example, light emitted from red, green and blue LEDs may visually combine to appear as white to a viewer in the far field. However, this combination may not be uniform if the multiple emitters are not properly reflected by the illumination assembly. The exemplary illumination assembly described herein uniformly reflects light from each of a number of light emitters in the assembly regardless of the physical layout or arrangement of the light emitters.

Figure 1:
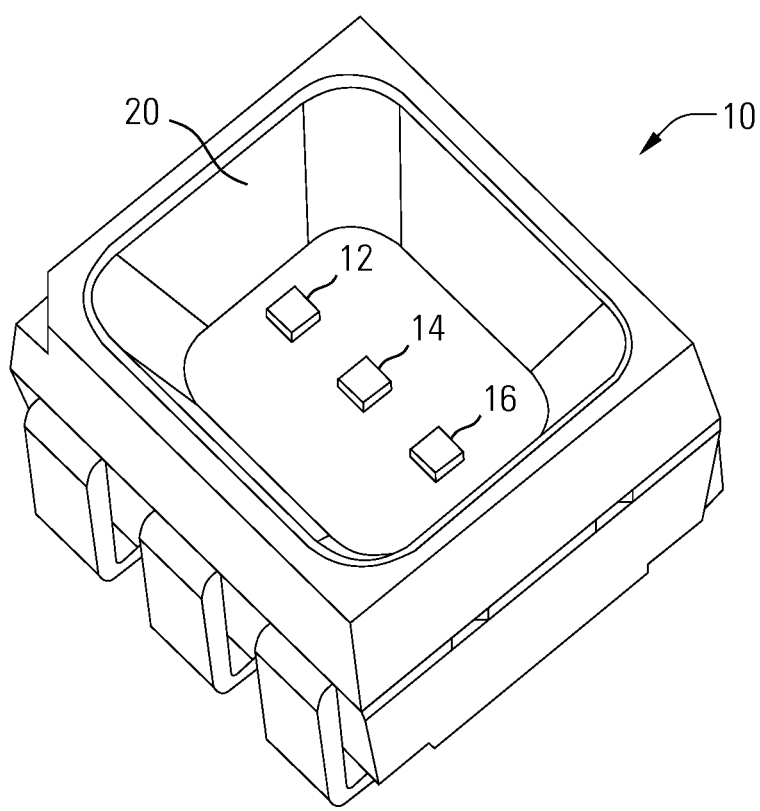
FIG. 1 is a top perspective view of a prior art illumination assembly having multiple emitters in a single reflector cup.
Figure 2:
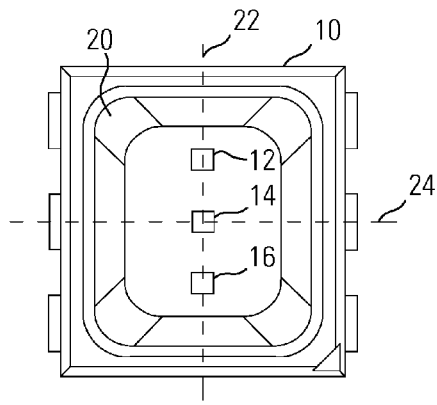
FIG. 2 is a top view of a prior art illumination assembly having multiple emitters arranged in a line in a single reflector cup.
Figure 3:
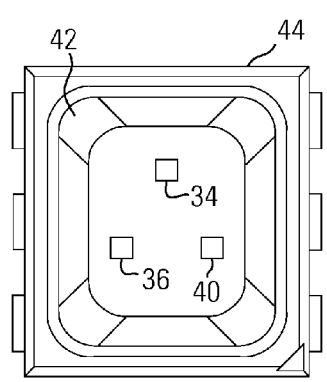
FIG. 3 is a top view of a prior art illumination assembly having multiple emitters arranged nonlinearly in a single reflector cup.
Figure 4:
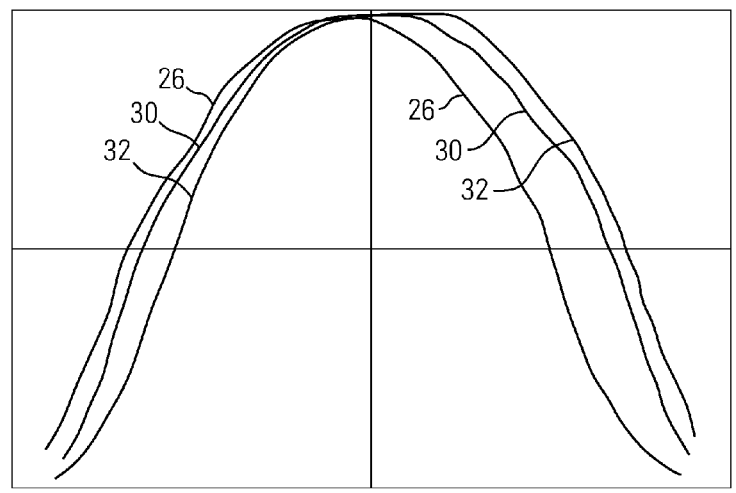
FIG. 4 is an exemplary plot of the far field radiation patterns in a vertical direction of the prior art illumination assembly of FIG. 2.

Referring now to FIGS. 1-4, a prior art illumination assembly 10 will be described in which multiple light emitters 12, 14 and 16 are placed in a single reflector cup 20. The light emitters 12-16 may be arranged in a line as illustrated in FIG. 2 wherein the light emitters 12-16 are aligned along a vertical axis 22. The light emitters 12-16 are thus all placed symmetrically in the reflector cup 20 along a horizontal axis 24, but not along the vertical axis 22. The far field radiation pattern in the vertical direction for this arrangement is shown in FIG. 4. The radiation patterns 26, 30 and 32 for the light emitters 12, 14 and 16, respectively are mismatched and skewed across the vertical direction. Light emitters 34, 36 and 40 may also have a nonlinear arrangement, such as the triangular arrangement in the single reflector cup 42 of the prior art illumination assembly 44 of FIG. 3. The asymmetrical placement of the light emitters 34-40 in a single reflector cup 42 will have a similarly mismatched far field radiation pattern as the illumination assembly 10 of FIGS. 1 and 2. In a color illumination assembly in which the three light sources are of different colors that combine to form a white light or any other desired color, this mismatched far field radiation pattern skews the perceived color from the display.

Figure 5:
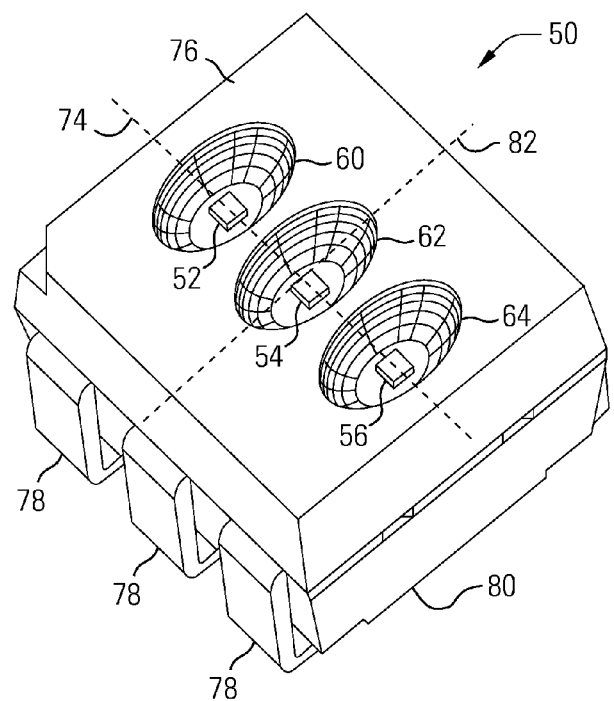
FIG. 5 is a top perspective view of an exemplary illumination assembly having multiple emitters in individual reflector cups.
Figure 6:
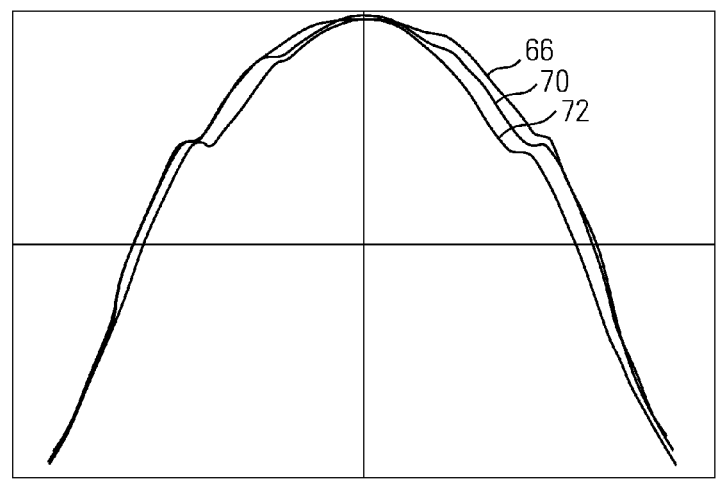
FIG. 6 is an exemplary plot of the far field radiation patterns in a vertical direction of the illumination assembly of FIG. 5.

Referring now to FIGS. 5 and 6, an illumination assembly 50 having multiple light emitters 52, 54 and 56 and improved far field radiation patterns will be described. Each light emitter 52, 54 and 56 is placed in its own reflector cup 60, 62 and 64, respectively, enabling the far field radiation pattern from the emitters 52-56 to be matched or otherwise tailored as desired. In this exemplary embodiment, the reflector cups 60-64 are identically shaped so that the far field radiation patterns 66, 70 and 72 are substantially matched in the vertical direction 74 as illustrated in FIG. 6. Alternatively, each reflector cup 60-64 may be uniquely shaped to tailor the far field radiation patterns as desired.

The light emitters 52-56 and reflector cups 60-64 may be numbered, shaped and positioned as desired. For example, in the embodiment illustrated in FIG. 5, three light emitters 52-56 and associated oval reflector cups 60-64 are positioned on a top surface 76 of a surface mount illumination assembly 50, opposite electrical connections such as surface mount leads 78 on a bottom surface 80 of the illumination assembly 50. Alternatively, the illumination assembly 50 may emit light from a side surface or end surface, etc as desired. As will also be described in more detail, the shape of the reflector cups 60-64 may be altered to shape the far field radiation pattern as desired. In this exemplary embodiment, oval reflector cups 60-64 are used to meet hypothetical requirements of a display employing an array of illumination assemblies (e.g., 50), wherein a large viewing angle is needed in a horizontal direction 82, but a large viewing angle is not needed in the vertical direction 74. (Note that the terms horizontal and vertical directions are not absolute terms, and that the illumination assemblies may be mounted in a display in any desired orientation.) The long axis of the reflector cups 60-64 in the horizontal direction 82 allows light from the light emitters 52-56 to spread out over a wide angle, producing a large viewing angle in the horizontal direction 82. In contrast, by using a narrower axis in the reflector cups 60-64 in the vertical direction 74, the light in the vertical direction 74 is more narrowly directed, producing a narrower viewing angle in the vertical direction 74 and consequently increasing the brightness within that viewing angle. Regardless of the desired viewing angle, the use of an independent reflector cup (e.g., 60-64) for each light emitter (e.g., 52-56) enables the far field radiation patterns to be matched or otherwise tailored as desired.

The light emitters 52-56 may comprise any suitable light source, such as light emitting diodes, in die form or packaged as desired, laser diodes, fluorescent sources, fiber optic waveguides leading to one or more remote light sources, etc. Any number and color of light emitters may be employed in an illumination assembly. In one exemplary embodiment, a multicolor illumination assembly may be formed by including a red, a green and a blue LED die (e.g., 52-56) that visually combine to form a white or other desired overall color output from each individual illumination assembly. Alternatively, an overall white or other desired color light may be formed in a display using multiple monochromatic illumination assemblies. For example, an illumination assembly having one or more red light emitters may be combined with a second illumination assembly having one or more green light emitters and a third illumination assembly having one or more blue light emitters. Each illumination assembly may include a single light emitter, two light emitters, or three light emitters, etc. as desired.

Figure 7:
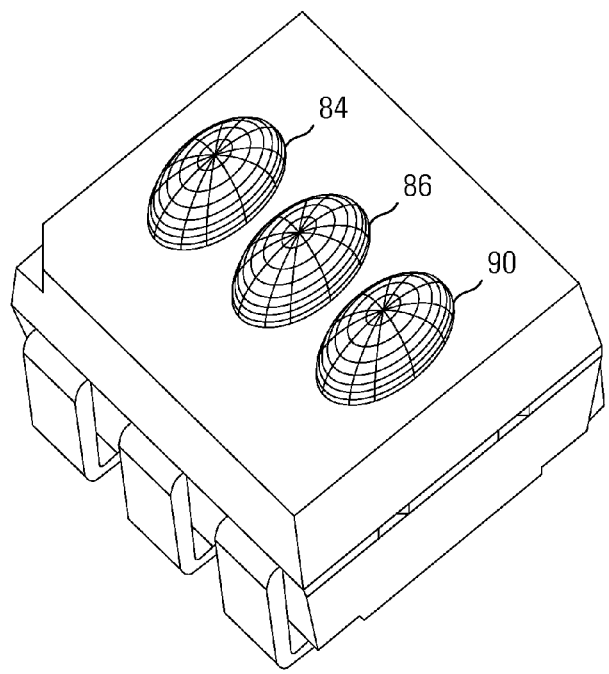
FIG. 7 is a top perspective view of an exemplary illumination assembly having multiple emitters with individual lenses.
Figure 8:
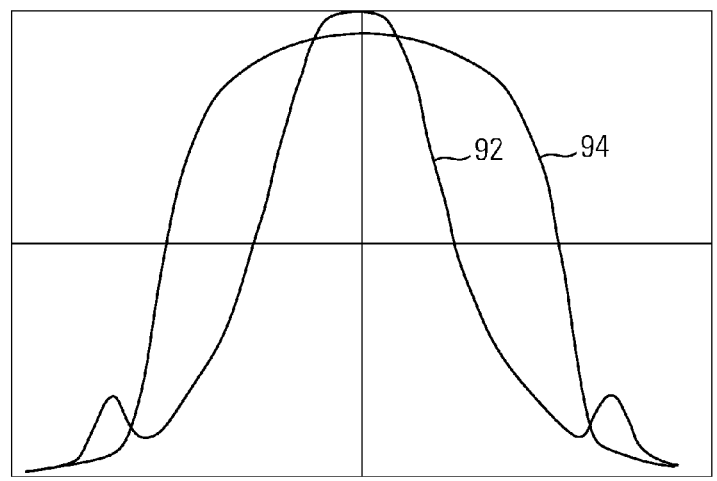
FIG. 8 is an exemplary plot of the far field radiation patterns in a vertical direction of the illumination assembly of FIG. 7.

Referring now to FIGS. 7 and 8, an exemplary embodiment will be described in which lenses 84, 86 and 90 are placed adjacent each light emitter. For example, each lens 84-90 may be placed such that its individual optical axis is aligned to the center of the associated light emitter. The lenses 84-90 may have any desired type and shape. For example, the lenses 84-90 may be convex, concave, Fresnel lenses, etc or a combination of multiple types and shapes. The lenses 84-90 may have the same shape as the underlying reflector cup if desired, such as the oval lenses 84-90 illustrated in FIG. 7 and corresponding with the oval reflector cups 60-64 of FIG. 5, or may have any other shape. The lenses 84-90 may be used to further shape the far field radiation pattern, for example, to a narrower far field radiation pattern 92 (FIG. 8) with greater on-axis brightness than that 94 generated without a lens.

The lenses 84-90 may be individually formed and attached elements, or may be formed as a single unit having multiple lensing regions. The lenses 84-90 may be fabricated using any suitable method, such as using a transfer-molding process. The lenses 84-90 may also be positioned and mounted adjacent the light emitters using any suitable method, such as by attaching them to the illumination assembly using an adhesive.

Figure 14:
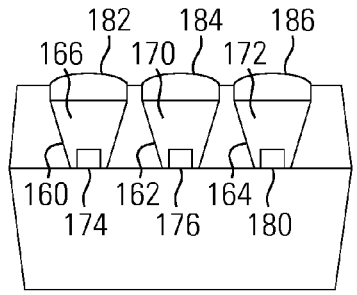
FIG. 14 is a side cross-sectional view of an exemplary illumination assembly with encapsulant and a lens.
Figure 15:
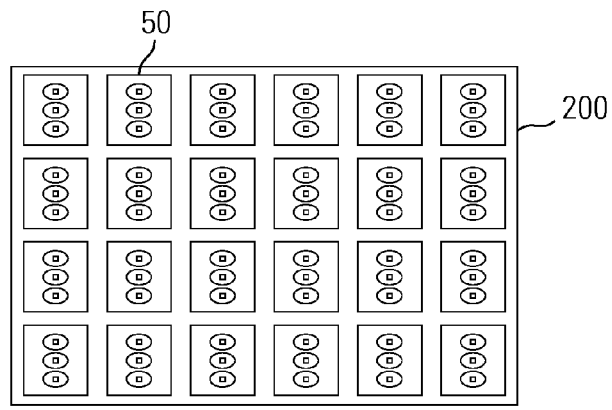
FIG. 15 is an exemplary display having an array of illumination assemblies with multiple emitters.

Referring now to FIGS. 9-13, a variety of exemplary reflector cup configurations will be described. However, the illumination assembly having multiple emitters is not limited to any of the configurations to be discussed, and may be adapted as needed to produce the desired far field radiation pattern. Emitters (e.g., 100, 102 and 104) may be arranged in a line as in the illumination assembly 106 of FIG. 9. Alternatively, emitters (e.g., 110, 112 and 114) may be arranged nonlinearly as in the triangle formation in the illumination assembly 116 of FIG. 10. The reflector cups may have any desired shape to create the needed radiation pattern. For example, reflector cups 120, 122 and 124 may have an oval shape as in the illumination assembly 106 of FIG. 9. Reflector cups 130, 132 and 134 may have a circular shape as in the illumination assembly 136 of FIG. 11. Reflector cups 140, 142 and 144 may have a square shape as in the illumination assembly 146 of FIG. 12. Reflector cups 150, 152 and 154 may have a rectangular shape as in the illumination assembly 156 of FIG. 13. Reflector cups 160, 162 and 164 may also be filled with an encapsulant material 166, 170 and 172 such as silicone or epoxy as illustrated in FIG. 14 to protect light emitters 174, 176 and 180 and to improve light extraction efficiency. As described above, lenses 182, 184 and 186 may be located above each light emitter 174-180 to further shape the radiation pattern. The reflector cups 160-164 may be coated with a reflective coating if desired, for example by adding a reflective aluminum coating using a sputter coating process. Any other suitable method and material may be used if desired to increase the reflectivity of the reflector cups 160-164.

An exemplary display 200 including an array of illumination assemblies (e.g., 50) is illustrated in FIG. 14. For example, large stadium displays may be formed by a two dimensional array of illumination assemblies (e.g., 50). The horizontal and vertical viewing angles of the display 200 may be controlled as described above by the shape of the reflector cups and by lenses as needed. The uniformity of the color produced by the display 200 is increased by the use of individual reflective cups for each of the multiple light emitters in each illumination assembly (e.g., 50) as described above.

Figure 16:
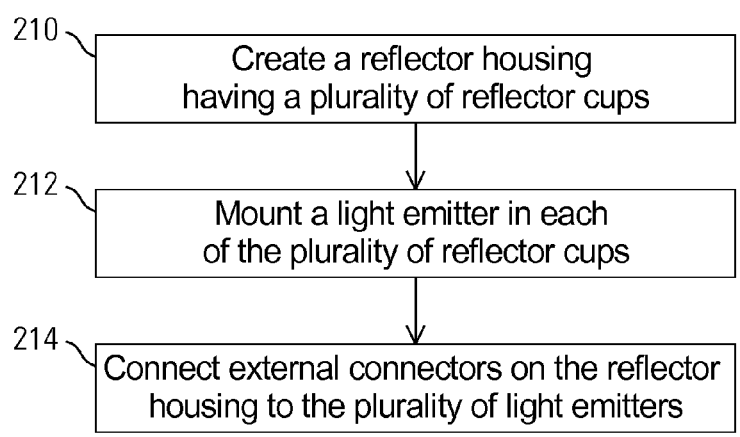
FIG. 16 is a flowchart of an exemplary operation for making an illumination assembly.

An exemplary method of making an illumination assembly is summarized in the flow chart of FIG. 16. A reflector housing having a plurality of reflector cups is created 210, and a light emitter is mounted 212 in each of the plurality of reflector cups. External connectors on the reflector housing, such as surface mount leads 78 or through hole pins are connected 214 to the plurality of light emitters. Optionally, the reflector cups may be coated with a reflective coating, the reflector cups may be filled with an encapsulant material, and lenses may be attached over the reflector cups.

The illumination assembly having multiple emitters, the display, and the method of making illumination assembly having multiple emitters described herein provide a multicolor light source having well matched far field radiation patterns for uniform colors, as well as controllable viewing angles and high on-axis brightness as allowed by the desired viewing angle.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An illumination assembly comprising:
   a surface mount reflector housing having a plurality of respective pairs of opposing surface mount leads extending from the surface mount reflector housing along a first axial direction; and
   a plurality of cavities formed in the surface mount reflector housing along a second axial direction crossing the first axial direction, wherein each of the plurality of cavities have a first axial length in the first axial direction and a second axial length in the second axial direction in which the first axial length is longer than the second axial length; and
   a plurality of LED dies mounted in the plurality of cavities such that each of the LED dies are respectively connected to a respective pair of opposing surface mount leads, wherein each of said plurality of cavities contains a single one of said plurality of LED dies,
   wherein the plurality of cavities comprise a plurality of reflective cups which each shape a reflected far field radiation pattern of an associated one of said LED dies such that each of the reflected far field radiation patterns of said illumination assembly are closely matched in the second axial direction; and
   lenses respectively mounted over the cavities to further shape the reflected far field radiation patterns to narrower far field radiation patterns with greater on-axis brightness than the reflected far field radiation patterns.

2. The illumination assembly of claim 1, said plurality of LED dies comprising at least a red LED die, a green LED die and a blue LED die.

3. The illumination assembly of claim 1, wherein at least one of said plurality of cavities has a shape selected from the group consisting of oval and rectangular.

4. The illumination assembly of claim 1, wherein at least one of said plurality of cavities is coated with a layer of reflective material.

5. The illumination assembly of claim 1, wherein at least one of said plurality of cavities is filled with an encapsulant.

6. The illumination assembly of claim 1, further comprising a plurality of surface mount leads connected to said plurality of LED dies.

7. The illumination assembly of claim 1, wherein said lenses are convex lenses.

8. The illumination assembly of claim 7, wherein at least one of said plurality of cavities is filled with an encapsulant and wherein at least one of said convex lenses is adhered to said encapsulant.

9. The illumination assembly of claim 1, wherein at least one of said plurality of cavities has a depth of about 1 millimeter and a width of about 2 millimeters.

10. A display, comprising:
    an array of surface mounted multi-color illumination assemblies and a plurality of respective pairs of opposing surface mount leads extending there from along a first axial direction, each of said illumination assemblies comprising:
    a surface mount reflector housing
    a plurality of reflective cups in the surface mount reflector housing along a second axial direction crossing the first axial direction, wherein each of the plurality of cups have a first axial length in the first axial direction and a second axial length in the second axial direction in which the first axial length is longer than the second axial length; and
    an LED die mounted in each of said plurality of reflective cups such that each LED die is respectively connected to a respective pair of opposing surface mount leads, wherein each of said reflective cups shapes a reflected far field radiation pattern of an associated one of said LED dies such that each of the reflected far field radiation patterns of each one of the illumination assemblies are closely matched in the second axial direction; and
    lenses respectively mounted over the cups to further shape the reflected far field radiation patterns to narrower far field radiation patterns with greater on-axis brightness than the reflected far field radiation patterns.

* * * * *